United States Patent
Hirata et al.

[11] Patent Number: 5,953,357
[45] Date of Patent: Sep. 14, 1999

[54] SEMICONDUCTOR LASER

[75] Inventors: Shoji Hirata; Shiro Uchida; Koji Iwamoto; Hiroki Nagasaki; Tsuyoshi Tojyo, all of Kanagawa, Japan

[73] Assignee: Sony Corporation, Tokyo, Japan

[21] Appl. No.: 08/924,453

[22] Filed: Aug. 28, 1997

[30] Foreign Application Priority Data

Aug. 30, 1996 [JP] Japan .................................. 8-249134

[51] Int. Cl.⁶ .................................................. H01S 3/19
[52] U.S. Cl. .............................................. 372/46; 372/45
[58] Field of Search .................... 372/45, 46, 50

[56] References Cited

U.S. PATENT DOCUMENTS

| | | | |
|---|---|---|---|
| 5,136,601 | 8/1992 | Kajimura et al. | 372/45 |
| 5,235,609 | 8/1993 | Uchida et al. | 372/45 |
| 5,353,298 | 10/1994 | Makuta | 372/46 |
| 5,687,272 | 11/1997 | Vinchant et al. | 372/50 |
| 5,701,322 | 12/1997 | Nagai | 372/46 |

*Primary Examiner*—Rodney Bovernick
*Assistant Examiner*—Yisun Song
*Attorney, Agent, or Firm*—Hill & Simpson

[57] ABSTRACT

An AlGaInP-based buried-ridge semiconductor laser includes an n-type GaAs current blocking layer 8 buried in opposite sides of a ridge stripe portion 7 which is made of an upper-layer portion of a p-type AlGaInP cladding layer 4, p-type GaInP intermediate layer 5 and p-type GaAs contact layer 6. The ridge stripe portion 7 includes tapered regions 7a having the length of L1 at cavity-lengthwise opposite ends of the ridge stripe portion 7.

14 Claims, 5 Drawing Sheets

5,953,357

SEMICONDUCTOR LASER

BACKGROUND OF THE INVENTION

1. Field of the Invention

The present invention relates generally to the field of semiconductor lasers, and more particularly, the present invention relates to a semiconductor laser suitable for use as a light source of an optical disc device, for example.

2. Description of the Related Art

One known semiconductor laser having a design of a stabilized transverse mode is a buried-ridge semiconductor laser having a striped structure. FIG. 10 is a perspective view of a conventional AlGaInP-based buried-ridge semiconductor laser having a straight striped structure.

As shown in FIG. 10, the AlGaInP-based buried-ridge semiconductor laser having a straight striped structure is formed by sequentially stacking an n-type AlGaInP cladding layer 102, a GaInP active layer 103, a p-type AlGaInP cladding layer 104, a p-type GaInP intermediate layer 105 and a p-type GaAs contact layer 106 on an n-type GaAs substrate 101.

An upper-layer portion of the p-type AlGaInP cladding layer 104, the p-type GaInP intermediate layer 105 and the p-type GaAs contact layer 106 form a straight ridge stripe extending in one direction. Numeral 107 denotes a ridge stripe portion made of the upper-layer portion of the p-type AlGaInP 104, the p-type GaInP intermediate layer 105 and the p-type GaAs contact layer 106. The straight ridge stripe portion 107 has a uniform width W' in the cavity lengthwise direction. The width W' of the ridge stripe portion 107 is the width of the bottom of the ridge stripe portion 107. N-type GaAs current blocking layers 108 are buried in opposite sides of the ridge stripe portion 107 to form a current blocking structure.

The laser includes a p-side electrode 109, such as, for example, a Ti/Pt/Au electrode, formed on the p-type GaAs contact layer 106 and the n-type GaAs current blocking layer 108. An n-side electrode 110, such as, for example, a AuGe/Ni/Au electrode is formed on the bottom surface of the n-type GaAs substrate 101.

The conventional AlGaInP-based buried-ridge semiconductor laser selects the width W' of the ridge stripe portion 107 to be 5 μm or less in order to stabilize the transverse mode.

Additionally the semiconductor laser controls its guide mechanism in accordance with thickness d' of the p-type AlGaInP cladding layer 104 at opposite sides of the ridge stripe portion 107. More specifically, the guide mechanism of the buried-ridge semiconductor laser is real index-guided when the thickness d' of the p-type AlGAInP cladding layer 104 is 100 to 300 nm, intermediate between real index-guided and gain-guided natures when the thickness d' is 300 to 500 nm, and gain-guided when the thickness d' is 500 nm or more.

When the guide mechanism of the conventional buried-ridge semiconductor laser is real index-guided, the transverse mode is confined by a step in index of refraction formed in parallel to the junction. When it is gain-guided, the transverse mode is confined due to a gain distribution caused by distribution of injected carriers.

It is known that self-pulsation occurs when the guide mechanism is intermediate between real index-guided and gain-guided natures. In this case, although the transverse mode is confined by a step in refractive index made in parallel with the junction, the step in refractive index is smaller than that of the real index-guided structure, and extension of light in parallel with the junction is larger than that of the real index-guided structure. Therefore, as shown in FIG. 11, the width $W_p'$ of the light confinement region becomes larger than the width $W_g'$ of the gain region in the GaInP active layer 103. As a result, a saturable absorber 111 is produced in the GaInP active layer 103 at opposite sides of the ridge stripe portion 107 due to the difference between the light confinement region and the gain region.

However, the conventional buried-ridge semiconductor laser having a straight stripe structure has the following problems. Specifically, the width W, of the ridge stripe portion 107 having a straight shape must be 5 μm or less in order to maintain a stable transverse mode. In this case, as the contact area of the p-type GaAs contact layer 106 and the p-side electrode 109 decreases, the current path is narrowed, and the differential resistance increases, which causes an increase in required driving voltage of the semiconductor laser.

When the conventional buried-ridge semiconductor laser is used as a light source of an optical disc device, for example, it is effective to minimize the spot of laser light on the emitting end surface and to enlarge the horizontal radiation angle $\Theta//$ in the far field pattern to 8° or more approximately. For this purpose, the width W' of the ridge stripe portion 107 must be narrower. In this case, however, the gain region in the GaInP active layer 103 becomes narrow, and distribution of light to regions with a high absorption coefficient becomes larger. Therefore, the guide loss increases, and the drive current of the semiconductor laser increases. This is important when the conventional buried-ridge semiconductor laser has a real index-guided structure liable to decrease the radiation angle $\Theta//$. If the conventional buried-ridge semiconductor laser has a gain-guided structure, the far field pattern of the laser light appears as double lobes, and may cause problems for practical use.

When the conventional buried-ridge semiconductor laser is used as a light source of an optical disc device, for example, it is effective to configure the conventional buried-ridge semiconductor laser for self-pulsation in order to reduce the noise. In this case, however, since the range of allowable values of laser structure parameters (for example, thickness d' of the p-type AlGaInP cladding layer 104 at opposite sides of the ridge stripe portion 107) is very small, the yield is low, and it is difficult to realize a self-pulsation semiconductor layer. Additionally, since the saturable absorber 111 generated by a difference between the gain region and the light confinement region of the GaInP active layer 103 is unstable with changes in temperature and optical output during operation, self-pulsation is unstable.

SUMMARY OF THE INVENTION

It is an object of the invention is to provide a semiconductor laser which can reduce the drive voltage, increase the horizontal radiation angle in the far field pattern and shape the far field pattern, and can be readily configured to behave as a stable self-pulsation semiconductor laser.

According to the invention, there is provided a semiconductor laser comprising a first cladding layer of a first conduction type; an active layer on the first cladding layer; a second cladding layer of a second conduction type on the active layer; and a current blocking layer of the first conduction type having an absorption effect on light from the active layer, the current blocking layer being buried in opposite sides of a stripe portion of the second cladding layer to form a current blocking structure, wherein the stripe portion includes tapered regions at cavity-lengthwise opposite ends thereof, the tapered regions decreasing in width from a cavity-lengthwise central portion thereof toward the cavity-lengthwise opposite ends.

In an aspect of the invention, the semiconductor laser is of a self-pulsation type, and the thickness of the second cladding layer at opposite sides of the stripe portion is, preferably, 300 to 800 nm.

According to the invention having the above construction, since the stripe portion has tapered regions at opposite ends in the lengthwise direction of the cavity, which gradually decrease the width from the central portion to the opposite end portions in the lengthwise direction of the cavity, the width of the stripe portion can be held sufficiently wide in the central portion thereof even when the width of the stripe portion is narrowed at opposite end portions in order to maintain stabilization of the transverse mode. As a result, the stripe portion can contact with the electrode over a wide area, promising a wide current path and a decrease in differential resistance, and hence reducing the drive voltage of the semiconductor laser.

Due to a wave surface shaping effect by the tapered regions at cavity-lengthwise end portions of the stripe portion, the horizontal radiation angle of the far field pattern can be increased to approximately 8° or more. Therefore, the semiconductor laser need not narrow the stripe width for enlarging the horizontal radiation angle of the far field pattern, it can reliably shape the far field pattern. Additionally, due to the wave surface shaping effect, the far field pattern exhibits a single lobe when the guide mechanism is gain-guided.

Since the cross-sectional structure changes in the cavity-lengthwise direction, parts of the active layer along the tapered regions of the stripe portion behave as saturable absorbers when the semiconductor laser is a self-pulsation laser. Therefore, saturable absorbers are stable, and self-pulsation is stable, as compared with those of a self-pulsation laser using the conventional buried-ridge semiconductor laser. Accordingly, since the range of allowable values for the thickness of the second cladding layer at opposite sides of the stripe portion can be increased to 300 to 800 nm in order to realize a self-pulsation semiconductor laser, the yield of the semiconductor laser configured for self-pulsation is improved, and self-pulsation semiconductor lasers can be obtained easily.

DESCRIPTION OF THE PREFERRED EMBODIMENTS

Figure 1:
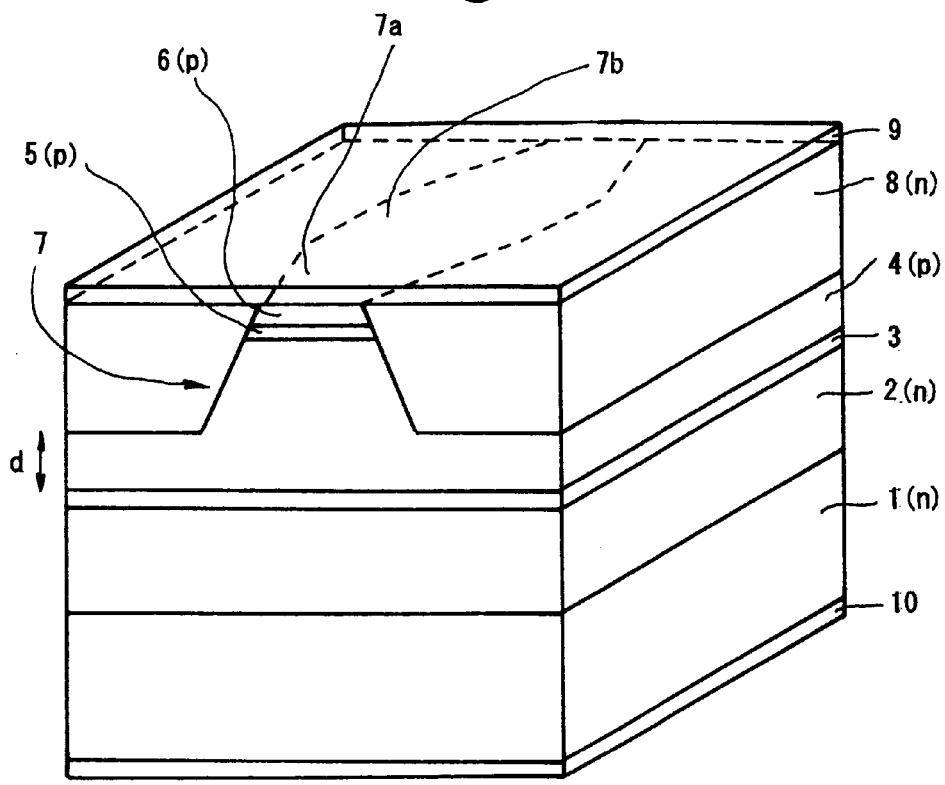
FIG. 1 is a perspective view showing an AlGaInP-based buried-ridge semiconductor laser according to a first embodiment of the invention.

Embodiments of the invention are explained below with reference to the drawings. Identical or equivalent elements or parts are labeled with common reference numerals in all figures of embodiments.

Figure 2:
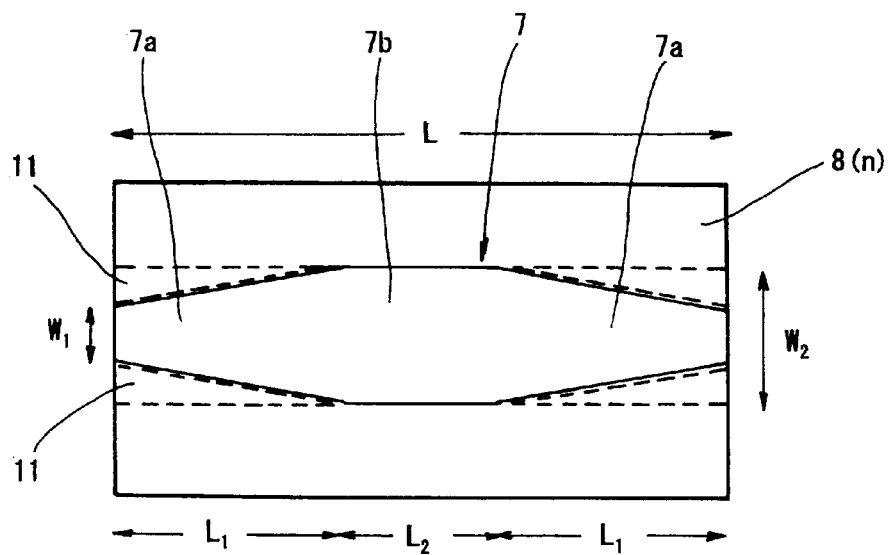
FIG. 2 is a plan view showing the AlGaInP-based buried-ridge semiconductor laser according to the first embodiment of the invention.

FIGS. 1 and 2 illustrate a first embodiment of the invention having an AlGaInP-based buried-ridge semiconductor laser. FIG. 1 is a perspective view, and FIG. 2 is a plan view.

As shown in FIGS. 1 and 2, the AlGaInP-based buried-ridge semiconductor laser includes an n-type GaAs substrate 1 on which an n-type AlGaInP cladding layer 2, for example $(Al_{0.7}Ga_{0.3})_{0.5}In_{0.5}P$, a GaInP active layer 3, for example $Ga_{0.5}P$, a p-type AlGaInP cladding layer 4, for example $(Al_{0.7}Ga_{0.3})_{0.5}In_{0.5}P$, a p-type GaInP intermediate layer 5, for example $Ga_{0.5}In_{0.5}P$ and a p-type GaAs contact layer 6 are stacked sequentially.

An upper-layer portion of the p-type AlGaInP cladding layer 4, the p-type GaInP intermediate layer 5 and the p-type GaAs contact layer 6 form a ridge stripe extending in one direction. Numeral 7 denotes a ridge stripe comprised of the upper-layer portion of the p-type AlGaInP 4. The p-type GaInP intermediate layer 5 and the p-type GaAs contact layer 6 are formed on the ridge of AlGaInP 4. N-type GaAs current blocking layers 8 are buried in opposite sides of the ridge stripe portion 7 to form a current blocking structure.

The laser includes a p-side electrode 9, such as Ti/Pt/Au electrode, formed on the p-type GaAs contact layer 6 and the n-type GaAs current blocking layer 8. Formed on the bottom surface of the n-type GaAs substrate 1 is an n-side electrode 10, such as AuGe/Ni/Au electrode.

In the AlGaInP-based buried-ridge semiconductor laser, the ridge stripe portion 7 has tapered regions 7a at opposite end portions in the cavity-lengthwise direction. Each tapered region 7a continuously decreases its width from the central portion toward the end portion in the cavity-lengthwise direction. The ridge strip portion 7 also includes a straight region 7b at a central region in the cavity-lengthwise direction, which has a constant width. In this case, the tapered regions 7a at the cavity-lengthwise ends of the ridge stripe portion 7 have substantially the same length $L_1$, and the total length $2L_1$ of both tapered regions 7a is not less than one tenth of the cavity length L, that is, $2L_1 \geq L/10$. $L_2$ is the length of the straight region 7b.

$W_1$ is the width of the ridge stripe portion 7 at cavity-lengthwise opposite end surfaces, and $W_2$ is the width of the cavity-lengthwise central portion of the ridge stripe portion 7. It is defined that widths $W_1$ and $W_2$ are those of the bottom of the ridge stripe portion 7 at cavity-lengthwise end surfaces and cavity-lengthwise central portion. Width $W_1$ of the ridge stripe portion 7 at cavity-lengthwise opposite end surfaces and width $W_2$ of the cavity-lengthwise central portion are determined to satisfy $W_1 < W_2$, $W_1 \leq 5$ μm and $W_2 \leq 7$ μm.

An example of laser structure parameters of the buried-ridge semiconductor laser is: cavity length L=400 μm, length $L_1$ of each tapered region 7a of the ridge stripe portion 7=100 μm, length $L_2$ of the straight region 7b of the ridge stripe portion 7=200 μm, width $W_1$ of the ridge stripe portion 7 at each cavity-lengthwise end surface =4 μm, and width $W_2$ of the cavity-lengthwise central portion of the ridge stripe portion 7=6 μm.

In the buried-ridge semiconductor laser having the above construction, the transverse mode can be stabilized when the width $W_1$ of the ridge stripe portion 7 at each cavity-lengthwise end is not larger than approximately 5 μm (in this case, 4 μm).

Figure 3:
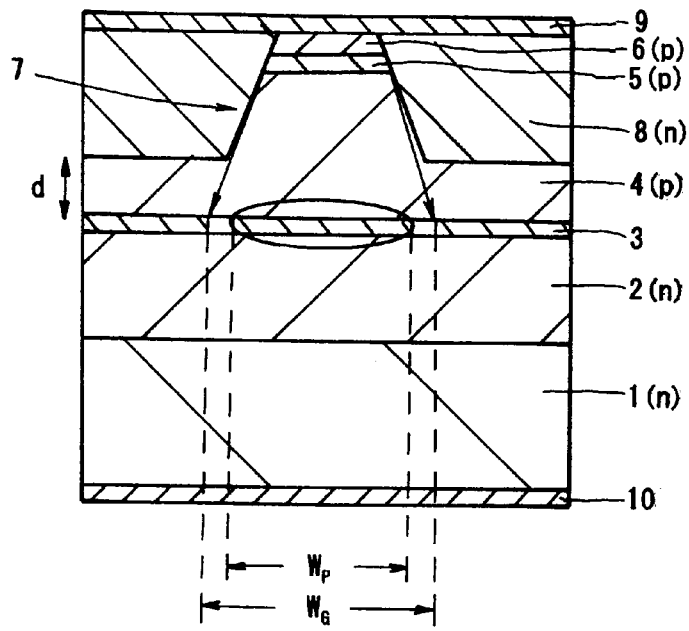
FIG. 3 is a cross-sectional view for explaining behaviors of the AlGaInP-based buried-ridge semiconductor laser according to the first embodiment of the invention.
Figure 4:
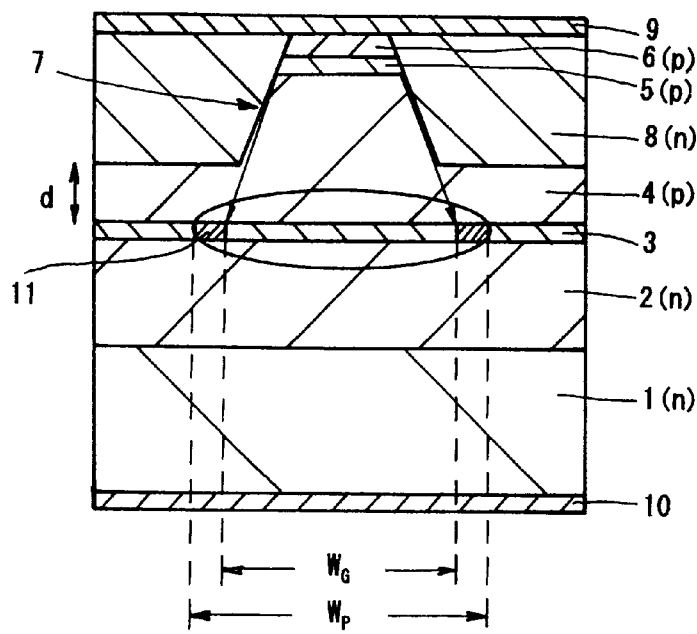
FIG. 4 is a cross-sectional view for explaining behaviors of the AlGaInP-based buried-ridge semiconductor laser according to the first embodiment of the invention.

Moreover, in the buried-ridge semiconductor laser, the optical guide mechanism is controlled in accordance with the thickness d of the p-type AlGaInP cladding layer 4 at opposite sides of the ridge stripe portion 7. More specifically, the guide mechanism of the buried-ridge semiconductor laser is real index-guided when the thickness d of the p-type AlGaInP cladding layer 4 is 100 to 300 nm at opposite sides of the ridge stripe portion 7, intermediate between real index-guided and gain-guided natures when d is 300 to 800 nm, and gain-guided when d is 800 nm or more. It is known that a self-pulsation semiconductor laser can be obtained when the laser is intermediate between real index-guided and gain-guided natures. Therefore, by changing the thickness d of the p-type AlGaInP cladding layer 4 at opposite sides of the ridge stripe portion 7, the buried-ridge semiconductor laser can realize either a real index-guided semiconductor laser, self-pulsation semiconductor laser or gain-guided semiconductor laser. FIGS. 3 and 4 are cross-sectional views for explaining behaviors of such buried-ridge semiconductor lasers. FIG. 3 shows one having a guide mechanism of a real index-guided structure or a gain-guided structure, and FIG. 4 shows one having a guide mechanism of an intermediate nature between real index-guided and gain-guided natures.

In the arrangement where the guide mechanism of the buried-ridge semiconductor laser is real index-guided, the transverse mode is confined by a step in refractive index formed in parallel with the junction. When it is gain-guided, the transverse mode is confined by gain distribution produced by distribution of injected carriers. In both cases, width $W_P$ of the light confinement region is smaller than the width $W_G$ of the gain region in the GaInP active layer 3 as shown in FIG. 3.

When the guide mechanism is intermediate between real index-guided and gain-guided structures, the transverse mode is confined by a step in refractive index formed in parallel with the junction. However, since the step in refractive index is smaller than that of the real index-guided structure, extension of light in parallel with the junction is larger than that of the real index-guided structure. In this case, as shown in FIG. 4, width $W_P$ of the light confinement region is larger than the width $W_G$ of the gain region in the GaInP active layer 3. Part of the light confinement region outside the gain region in the GaInP active layer 3 forms a saturable absorber 11. The portion behaving as the saturable absorber 11 corresponds to the portion encircled by a dotted line in FIG. 2, namely, the peripheral portion of the tapered region 7a of the ridge stripe portion 7. This is because the cross-sectional structure varies in the cavity-lengthwise direction in the tapered region 7a of the ridge stripe portion 7. In this case, since the saturable absorber 11 is a built-in fixed structure, it is stable.

The buried-ridge semiconductor laser has the following advantages. That is, since the ridge stripe portion 7 has the tapered regions 7a at opposite cavity-lengthwise end portions and the cavity-lengthwise central portion having a larger width $W_2$ than the width W1 at cavity-lengthwise opposite end surfaces, width $W_2$ of the cavity-lengthwise central portion can be made large to ensure a large contact area between the p-type GaAs contact layer 6 and the p-side electrode 9 while the width $W_1$ at cavity-lengthwise end surfaces is made as small as approximately 5 μm to maintain stabilization of the transverse mode. Therefore, the current path is enlarged, and the differential resistance decreases. Accordingly, the drive voltage can be reduced.

Moreover, due to the wave surface shaping effect of the tapered regions 7a of the ridge stripe portion 7, the spot of the laser light at the emitting end surface can be made small, and the horizontal radiation angle $\ominus //$ of the laser light in the far field pattern can be enlarged to approximately 8° or more. Therefore, the embodiment need not reduce the width $W_1$ of the ridge stripe portion 7 at cavity-lengthwise ends too much in order to increase the radiation angle $\ominus //$, and can avoid an increase in drive current caused by a guide loss which will be inevitable otherwise. As a result, the far field pattern of the laser light can be shaped reliably. This effect is especially salient when the guide mechanism of the buried-ridge semiconductor laser has a real index-guided structure in which the horizontal radiation angle $\ominus //$ is liable to decrease.

When the guide mechanism of the buried-ridge semiconductor laser is gain-guided, the light travelling in the cavity-lengthwise direction within the semiconductor laser becomes nearer to a flat wave due to the wave surface shaping effect of the tapered regions 7a of the ridge stripe portion 7. This results in the effect that the far field pattern of the laser light is modified into a form of a single lobe. As a result, problems in practical use can be prevented when the buried-ridge semiconductor laser is gain-guided.

When the guide mechanism of the buried-ridge semiconductor laser is intermediate between real index-guided and gain-guided structures, since part of the GaInP active layer 3 outside the tapered regions 7a of the ridge stripe portion 7 forms the fixed saturable absorber 11, its operation is stable against changes in temperature and optical output as compared with the saturable absorber 111 in the conventional buried-ridge semiconductor laser, which is formed by a difference between the gain region and the light confinement region in the GaInP active layer 103 and is therefore unstable. Additionally, since the range of allowable values for thickness d of the p-type AlGaInP cladding layer 4 at opposite sides of the ridge stripe portion 7 is increased to as large as 300 to 800 nm, a self-pulsation semiconductor laser can be realized easily.

Therefore, when the AlGaInP-based buried-ridge semiconductor laser having the tapered stripe structure is used as a light source of an optical disc device, for example, an increase in horizontal radiation angle $\ominus //$ in the far field pattern, shaping of the far field pattern and reduction of noise can be attained, and excellent characteristics can be realized.

Figure 5:
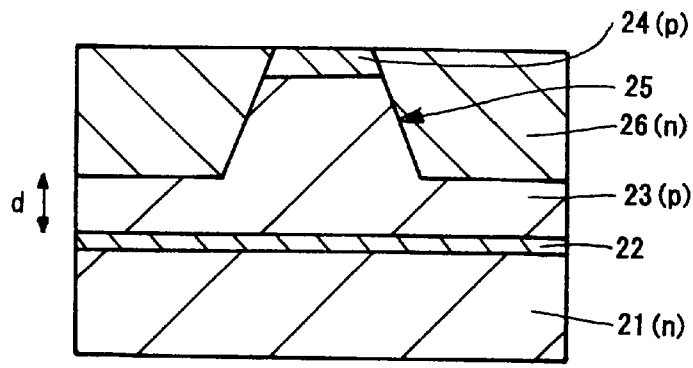
FIG. 5 is a cross-sectional view showing an AlGaAs-based buried-ridge semiconductor laser according to a second embodiment of the invention.

Next explained is a second embodiment of the invention. FIG. 5 is a cross-sectional view of an AlGaAs-based buried-ridge semiconductor laser taken as the second embodiment.

As shown in FIG. 5, in the AlGaInP-based buried-ridge semiconductor laser, sequentially stacked on a semiconductor substrate such as an n-type GaAs substrate, not shown, are an n-type $Al_{0.5}Ga_{0.5}As$ cladding layer 21, an $Al_{0.12}Ga_{0.88}As$ active layer 22, a p-type $Al_{0.5}Ga_{0.5}As$ cladding layer 23 and a p-type GaAs contact layer 24. The upper-layer portion of the p-type $Al_{0.5}Ga_{0.5}As$ cladding layer 23 and the p-type GaAs layer 24 has the form of a ridge stripe extending in one direction. Numeral 25 denotes the ridge stripe portion comprised of the upper-layer portion of the p-type $Al_{0.5}Ga_{0.5}As$ cladding layer 23. The p-type GaAs layer 24 is formed on the ridge stripe of cladding layer 23. The ridge stripe portion 25 has tapered regions at cavity-lengthwise opposite ends like the ridge stripe portion 7 in the buried-ridge semiconductor laser of the first embodiment shown in FIGS. 1 and 2, for example. Buried in opposite sides of the ridge stripe portion 25 is an n-type GaAs current blocking layer 26 to form a current blocking structure. In case that the semiconductor laser of this embodiment is a self-pulsation type, the thickness d of the p-type $Al_{0.5}Ga_{0.5}As$ cladding layer 23 at opposite sides of the stripe portion is 300 to 800 nm. Here again, the AlGaAs-based buried-ridge semiconductor laser attains the same effects as those of the first embodiment.

Figure 6:
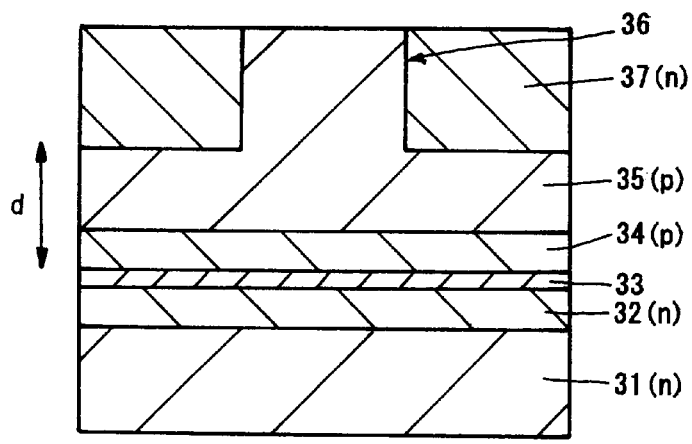
FIG. 6 is a cross-sectional view of a II–VI compound semiconductor-based buried-ridge semiconductor laser according to a third embodiment of the invention.
Figure 7:
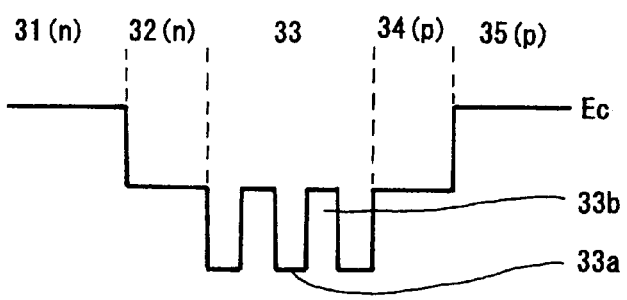
FIG. 7 is an energy band diagram of the II–VI compound semiconductor-based buried-ridge semiconductor laser according to the third embodiment of the invention.

Next explained is a third embodiment of the invention. FIG. 6 is a cross-sectional view of a II–VI compound semiconductor-based buried-ridge semiconductor laser taken as the third embodiment. The buried-ridge semiconductor laser has a separate confinement heterostructure (SCH). FIG. 7 is an energy band diagram of the buried-ridge semiconductor laser, particularly showing its conduction band. In FIG. 7, Ec indicates the bottom energy of the conduction band.

As shown in FIGS. 6 and 7, in the II–VI compound-based buried-ridge semiconductor laser, sequentially stacked on a substrate such as n-type GaAs substrate, not shown, are an n-type ZnMgSSe cladding layer 31, an n-type ZnSSe optical guide layer 32, an active layer 33 having a multiquantum well structure including ZnCdSe well layers 33a and ZnSSe barrier layers 33b, a p-type ZnSSe optical guide layer 34 and a p-type ZnMgSSe cladding layer 35. An upper-layer portion of the p-type ZnMgSSe cladding layer 35 has the form of a ridge stripe extending in one direction. Numeral 36 denotes the ridge stripe portion made of the upper-layer portion of the p-type ZnMgSSe cladding layer 35. The ridge stripe portion 36 has tapered regions at cavity-lengthwise opposite end portions like the ridge stripe portion 7 of the buried-ridge semiconductor laser of the first embodiment shown in FIGS. 1 and 2, for example. An n-type polycrystalline silicon (Si) current blocking layer 37 is buried in opposite side of the ridge stripe portion 36 to form a current blocking structure. In case that the semiconductor laser of this embodiment is a self-pulsation type, the thickness d of the p-type ZnMgSSe cladding layer 35 including the thickness of the optical guide layer 34 at opposite sides of the stripe portion is 300 to 800 nm,. The II–VI compound semiconductor-based semiconductor laser for emitting blue light according to the third embodiment gives the same effects as those of the first embodiment.

Figure 8:
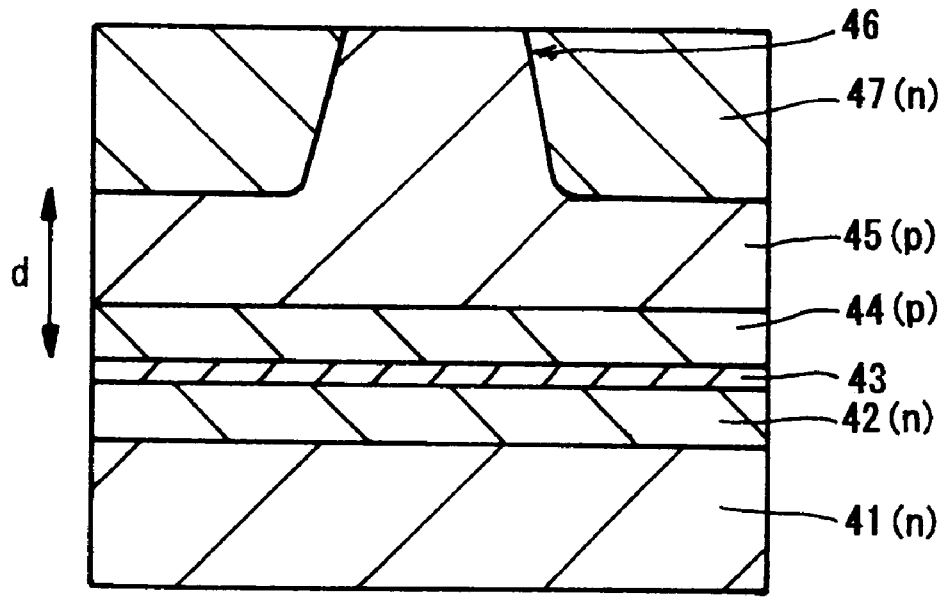
FIG. 8 is a cross sectional view showing a buried-ridge semiconductor laser using nitride-based III–V compound semiconductors according to a fourth embodiment of the invention.
Figure 9:
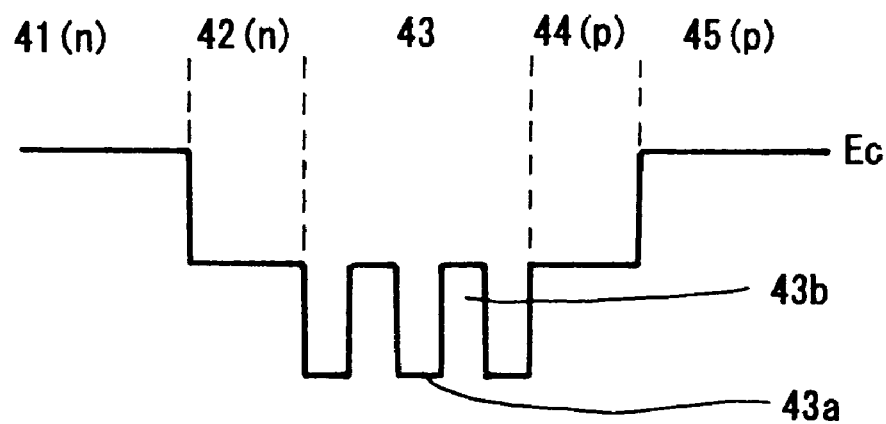
FIG. 9 is an energy band diagram of the buried-ridge semiconductor laser using nitride-based III–V compound semiconductors according to a fourth embodiment of the invention.
Figure 10:
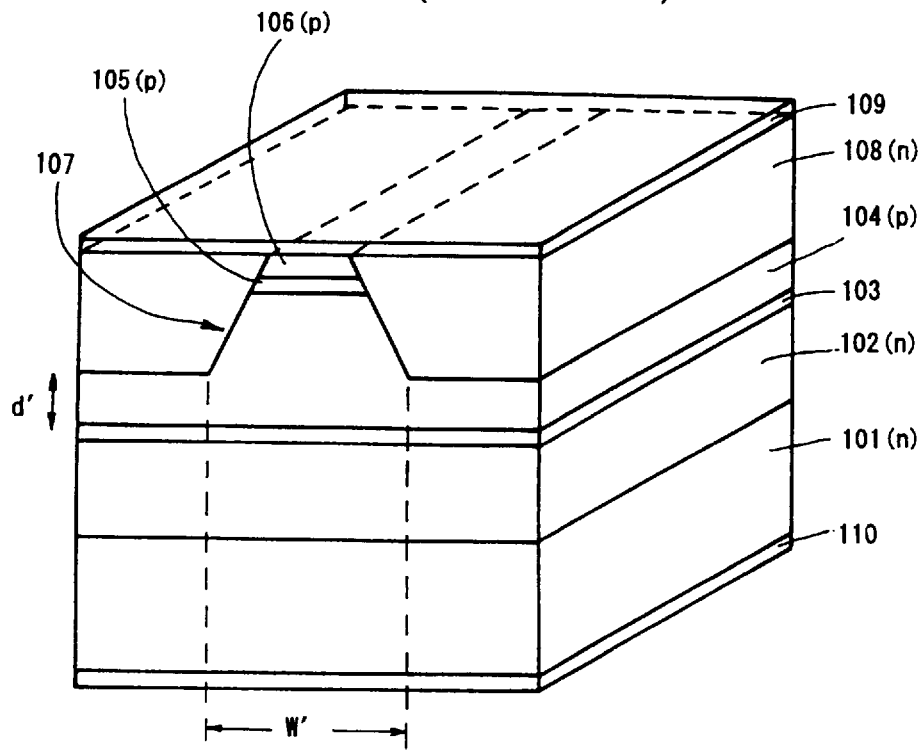
FIG. 10 is a perspective view showing a conventional AlGaInP-based buried-ridge semiconductor laser.
Figure 11:
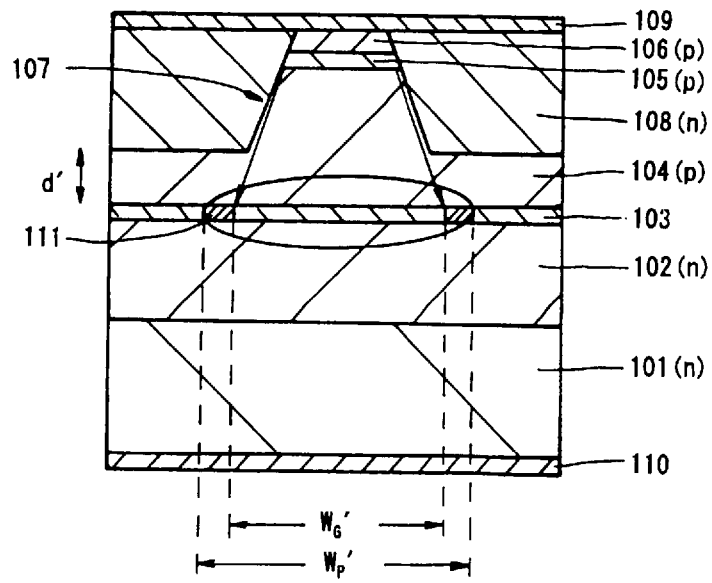
FIG. 11 is a cross-sectional view for explaining behaviors of the conventional AlGaInP-based buried-ridge semiconductor laser.

Next explained is a fourth embodiment of the invention. FIG. 8 is a cross-sectional view of a buried-ridge semiconductor laser using nitride-based III–V compound semiconductors, taken as the fourth embodiment. The buried-ridge semiconductor laser has SCH structure. FIG. 9 is an energy band diagram of the buried-ridge semiconductor laser, particularly showing its conduction band. In FIG. 9, Ec is the bottom energy of the conduction band.

As shown in FIGS. 8 and 9, in the buried-ridge semiconductor laser using nitride-based III–V compound semiconductors, sequentially stacked on a substrate such as sapphire substrate, not shown, are an n-type AlGaN cladding layer 41, an n-type GaN optical guide layer 42, an active layer 43 having a multiquantum well structure including GaInN well layers 43a and GaN barrier layers 43b, a p-type GaN optical guide layer 44, and a p-type AlGaN cladding layer 45. An upper-layer portion of the p-type AlGaN cladding layer 45 has the form of a ridge stripe extending in one direction. Numeral 46 denotes the ridge stripe portion made of the upper-layer portion of the p-type AlGaN cladding layer 45. The ridge stripe portion 46 has tapered regions at cavity-lengthwise opposite ends like the ridge stripe portion 7 in the buried-ridge semiconductor laser of the first embodiment shown in FIGS. 1 and 2. An n-type polycrystalline silicon (Si) current blocking layer 47 is buried in opposite sides of the ridge stripe portion 46 to form a current blocking structure. In case that the semiconductor laser of this embodiment is a self-pulsation type, the thickness d of the p-type AlGaN cladding layer 45 including the thickness of the optical guide layer at opposite sides of the stripe portion is 300 to 800 nm. The semiconductor laser using nitride-based III–V compound semiconductors for emitting blue light according to the fourth embodiment give the same effects as those of the first embodiment.

Although the invention has been described by way of embodiments thereof, the invention is not restricted to these embodiments but envisages various changes and modifications within the spirit and scope of the invention. For example, numerical values, materials, structures, and so forth, referred to in the embodiments, are only examples, and not limited to these examples. For example, in the first embodiment described above, tapered regions 7a at cavity-lengthwise opposite end portions of the ridge stripe portion 7 need not be equal in length, but may have different lengths. Additionally, length $L_2$ of the straight region 7b in the cavity-lengthwise center of the ridge stripe portion 7 may be 0 such that the ridge stripe portion 7 includes tapered regions 7a alone.

As described above, according to the invention, since the stripe portion includes tapered regions whose width decreases from the cavity-lengthwise center to cavity-lengthwise opposite ends, it can realize a decrease in drive voltage, an increase of the horizontal radiation angle in the far field pattern, and shaping of the far field pattern. At the same time, the invention can realize a semiconductor laser readily usable as a stable self-pulsation semiconductor laser.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A semiconductor laser comprising:
   a first cladding layer of a first conduction type;
   an active layer on said first cladding layer;
   a second cladding layer of a second conduction type on said active layer; and
   a current blocking layer of the first conduction type, said current blocking layer formed adjacent opposite sides of a stripe portion of said second cladding layer and said stripe portion including tapered regions at cavity-lengthwise opposite ends thereof, said tapered regions continuously decreasing in width from a cavity-lengthwise central portion thereof toward said cavity-lengthwise opposite ends.

2. The semiconductor laser according to claim 1 wherein said stripe portion has a width not larger than 5 μm at opposite end surfaces thereof in the cavity-lengthwise direction, a width not larger than 7 μm at a central portion thereof in the cavity-lengthwise direction.

3. The semiconductor laser according to claim 1 wherein the total length of said tapered regions at opposite ends of said stripe portion is not smaller than 1/10 of the cavity length.

4. The semiconductor laser according to claim 1 wherein said semiconductor laser is a self-pulsation semiconductor laser.

5. The semiconductor laser according to claim 4 wherein said second cladding layer has a thickness in the range from 300 nm to 800 nm at opposite sides of said stripe portion.

6. The semiconductor laser according to claim 1 wherein said semiconductor laser is an AlGaInP-based semiconductor laser.

7. The semiconductor laser according to claim 1 wherein said semiconductor laser is an AlGaAs-based semiconductor laser.

8. The semiconductor laser according to claim 1 wherein said semiconductor laser is made of II–VI compound semiconductors.

9. The laser according to claim 1 wherein said semiconductor laser is made of nitride-based III–V compound semiconductors.

10. The semiconductor laser according to claim 1 wherein said semiconductor laser is a real index-guided semiconductor laser.

11. The semiconductor laser according to claim 10 wherein said second cladding layer has a thickness in the range from 100 nm to 300 nm at opposite sides of said stripe portion.

12. The semiconductor laser according to claim 1 wherein said semiconductor laser is a gain-guided semiconductor laser.

13. The semiconductor laser according to claim 12 wherein said second cladding layer has a thickness in the range of 800 nm or more at opposite sides of said stripe portion.

14. The semiconductor laser according to claim 1 wherein the current blocking layer has an absorption effect on light from said active layer.

* * * * *